United States Patent
Song et al.

(10) Patent No.: US 9,632,129 B2
(45) Date of Patent: Apr. 25, 2017

(54) APPARATUS AND METHOD FOR CHECKING WHETHER SUB UNIT IS CONNECTED TO MAIN CONTROLLER

(71) Applicant: SAMSUNG ELECTRONICS CO., LTD., Suwon-si, Gyeonggi-do (KR)

(72) Inventors: Young-hwa Song, Suwon-si (KR); Yun-su Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 29 days.

(21) Appl. No.: 14/632,228

(22) Filed: Feb. 26, 2015

(65) Prior Publication Data
US 2016/0054371 A1 Feb. 25, 2016

(30) Foreign Application Priority Data
Aug. 19, 2014 (KR) .................. 10-2014-0107755

(51) Int. Cl.
G01R 31/04 (2006.01)
(52) U.S. Cl.
CPC ........... *G01R 31/04* (2013.01); *G01R 31/045* (2013.01)
(58) Field of Classification Search
CPC ................. G01R 1/203; G01R 31/04–31/048
USPC .............................................. 324/538, 76.12
See application file for complete search history.

(56) References Cited

U.S. PATENT DOCUMENTS

| | | | | |
|---|---|---|---|---|
| 5,436,827 A * | 7/1995 | Gunn | ........................ | G05B 9/03 361/695 |
| 5,805,903 A * | 9/1998 | Elkhoury | .............. | G06F 13/409 713/300 |
| 6,134,612 A * | 10/2000 | Bailey | .................. | G06F 1/1632 710/2 |
| 2004/0101133 A1* | 5/2004 | Le | ............................ | H04B 3/50 379/414 |
| 2004/0117681 A1* | 6/2004 | Mahony | ............... | H05K 7/1457 713/330 |
| 2004/0174131 A1* | 9/2004 | Sivertsen | ............... | G05B 11/28 318/639 |
| 2009/0169188 A1* | 7/2009 | Huang | ............... | H05K 7/20209 388/811 |
| 2010/0067877 A1* | 3/2010 | Ichimura | ........... | H04N 21/4307 386/239 |
| 2012/0212141 A1* | 8/2012 | Ryu | .................... | H05B 33/0827 315/186 |

(Continued)

FOREIGN PATENT DOCUMENTS

KR 0143885 4/1998

OTHER PUBLICATIONS

Identifying problems in Windows Device Manager, http://www.computerhope.com/issues/ch001212.htm; Apr. 2008.*

(Continued)

*Primary Examiner* — Patrick Assouad
*Assistant Examiner* — Demetrius Pretlow
(74) *Attorney, Agent, or Firm* — Staas & Halsey LLP

(57) ABSTRACT

Provided is an electronic device capable of checking whether a sub unit is connected to a main controller. The electronic device includes a main controller including a pulse width modulation (PWM) port, and at least one sub unit configured to receive a PWM signal from the main controller and to operate according to the PWM signal. The main controller checks whether the at least one sub unit is connected to the main controller via the PWM port.

19 Claims, 8 Drawing Sheets

(56) References Cited

U.S. PATENT DOCUMENTS

2015/0032284 A1* 1/2015 Chen .................... F04D 27/008
 700/300

OTHER PUBLICATIONS

EECS 461 Winter 2009 Lab 4: Pulse Width Modulation and Introduction to Simple Virtual Worlds http://web.eecs.umich.edu/~jfr/embeddedctrls/files/Lab4_W09.pdf; Sep. 2008.*

* cited by examiner

APPARATUS AND METHOD FOR CHECKING WHETHER SUB UNIT IS CONNECTED TO MAIN CONTROLLER

CROSS-REFERENCE TO RELATED APPLICATIONS

This application claims the benefit of Korean Patent Application No. 10-2014-0107755, filed on Aug. 19, 2014 in the Korean Intellectual Property Office, the disclosures of which are incorporated herein in their entireties by reference.

BACKGROUND

1. Field

One or more embodiments of the present disclosure relate to an apparatus and method for checking whether a sub unit is connected to a main controller.

2. Description of the Related Art

Electronic devices may each include a plurality of units. The plurality of units are connected to one another but may also be disconnected from one another. Thus, there is a need to check which units are disconnected from each other among the plurality of units.

A pull-up resistor and a pull-down resistor are elements that prevent units from being floated when no voltage is applied to the plurality of units. The pull-up resistor is used to apply a high voltage to a unit, and the pull-down resistor is used to apply a low voltage to a unit.

SUMMARY

One or more embodiments of the present disclosure include an apparatus and method for checking whether a sub unit is connected to a main controller.

Additional aspects will be set forth in part in the description which follows and, in part, will be apparent from the description, or may be learned by practice of the presented embodiments According to one or more embodiments of the present disclosure, an electronic device includes a main controller including a pulse width modulation (PWM) port; and at least one sub unit configured to receive a PWM signal from the main controller and to operate according to the PWM signal, wherein the main controller checks whether the at least one sub unit is connected to the main controller via the PWM port.

According to one or more embodiments of the present disclosure, a method of checking whether at least one sub unit is connected to a main controller includes using a pulse-width modulation (PWM) port of the main controller as an input port; measuring a voltage applied to the PWM port; and checking whether the at least one sub unit is connected to the PWM port, based on the measured voltage.

According to one or more embodiments of the present disclosure, an electronic device includes a main controller having a pull-up resistor or a pull-down resistor and a sub-unit of the main controller having the pull-up resistor or the pull-down resistor. The electronic device is further configured to determine whether the sub-unit is connected to the main controller using the pull-up resistor or the pull-down resistor.

The main controller may have a pulse width modulation (PWM) port that outputs a PWM signal The main controller may check whether the sub-unit is connected to the main controller, based on a voltage measured by the PWM port.

When the PWM port is used as an output port, the main controller may output the PWM signal to the sub-unit and may measure a voltage applied from the sub-unit to determine whether the sub-unit is connected to the main controller.

When the PWM port is used as an input port the main controller may measure a voltage applied from ground to determine whether the sub-unit is connected to the main controller.

The main controller may determine that the sub-unit is connected to the main controller when the voltage measured by the PWM port is a first voltage, and may determine that the sub-unit is not connected to the main controller when the voltage measured by the PWM port is a second voltage.

The sub-unit may include a plurality of sub-units. Further, the electronic device may include a display unit for displaying a result of determining whether each of the plurality of sub-units is connected to the main controller, where the display is configured to indicate whether each sub-unit is connected or not connected to the main controller.

The electronic device may be configured to determine whether the sub-unit is electrically connected to the main controller using the pull-up resistor or the pull-down resistor.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
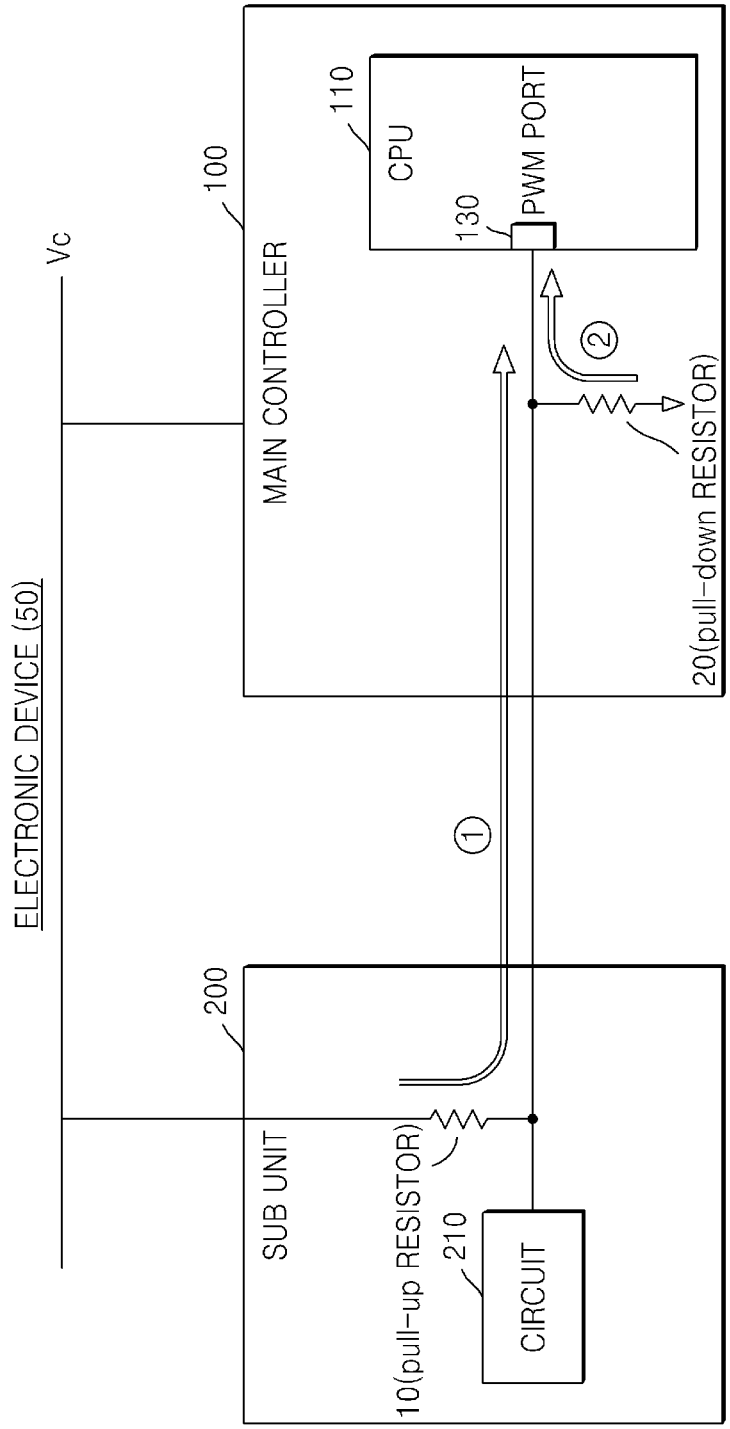
FIG. 1 illustrates an electronic device according to an embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, expressions such as "at least one of," when preceding a list of elements, modify the entire list of elements and do not modify the individual elements of the list.

FIG. 1 illustrates an electronic device 50 according to an embodiment of the present disclosure. Referring to FIG. 1, the electronic device 50 may include, for example, a main controller 100 and at least one sub unit 200. The electronic device 50 checks whether the at least one sub unit 200 is connected to the main controller 100. For example, the electronic device 50 may check whether the at least one sub unit 200 is electrically connected to the main controller 100.

In the electronic device 50 of FIG. 1, the main controller 100 measures a pull-up voltage of the at least one sub unit 200 when the at least one sub unit 200 is connected to the main controller 100. Also, the main controller 100 measures a ground voltage when the at least one sub unit 200 is not connected to the main controller 100.

The electronic device 50 includes the at least one sub unit 200 that is electrically connected to the main controller 100. For example, the electronic device 50 may be an image forming device, a mobile phone, a personal computer (PC), a tablet computer, a portable media player such as a CD or Blu-Ray Player, a wearable device such as a smart watch, etc. In particular, the image forming device may include at least one among a high-voltage power supply, a fan, and a motor, as the at least one sub unit 200. Thus, the image forming device is capable of checking whether at least one among the high-voltage power supply, the fan, and the motor is connected to the main controller 100.

When the electronic device 50 is embodied as a tablet computer, a portable media player or a mobile phone, the at least one sub unit 200 may comprise an external speaker, a battery charger, an external memory, a headset or headphones, an external display, or any other accessory that may be electrically connected to the electronic device 50.

The main controller 100 may include, for example, a central processing unit (CPU) 110 and a pull-down resistor 20. The CPU 110 includes a pulse width modulation (PWM) port 130. The CPU 110 outputs a PWM signal via the PWM port 130.

The CPU 110 uses the PWM port 130 as an output port or an input port. The CPU 110 may use the PWM port 130 as the output port or the input port according to a user command. In other words, the electronic device 50 may receive a user input instructing to use the PWM port 130 as the output port or the input port. The electronic device 50 may further include a manipulation unit 55 via which a user is capable of setting a tech mode, and may provide the user with information for selecting a mode via a user interface.

The CPU 110 outputs the PWM signal to the at least one sub unit 200 when the PWM port 130 is used as the output port, and measures a voltage applied from the at least one sub unit 200 or the ground when the PWM port 130 is used as the input port.

The CPU 110 uses the PWM port 130 as the input port to check whether the at least one sub unit 200 is connected to the main controller 100. A mode in which the CPU 110 uses the PWM port 130 as the input port is referred to as the tech mode (or a test mode). In the tech mode, the CPU 110 checks whether the at least one sub unit 200 is connected to the main controller 100, based on a voltage measured by the PWM port 130. For example, the CPU 110 determines that the at least one sub unit 200 is connected to the main controller 100 when the voltage measured by the PWM port 130 is a high voltage, and determines that the at least one sub unit 200 is not connected to the main controller 100 when the voltage measured by the PWM port 130 is a low voltage. Referring to FIG. 1, the high voltage is a voltage Vc and the low voltage is a ground voltage (0 volts). The voltage Vc is applied to the at least one sub unit 200 and the main controller 100. The voltage Vc may be generated in a power supplying device which supplies voltage from the outside of the at least one sub unit 200 and the main controller 100. In other words, the power supplying device may supply the voltage Vc to the at least one sub unit 200 and the main controller 100. For example, the voltage Vc may be equal to 5 V or 3.3 V. Although not shown, the CPU 110 may further include a voltage measuring unit and a comparator. The voltage measuring unit measures a voltage applied from the PWM port 130. The comparator compares the measured voltage with a preset threshold value. The CPU 110 determines whether the at least one sub unit 200 is connected to the main controller 100, based on a result of comparing the measured voltage with the preset threshold value.

The at least one sub unit 200 includes a circuit 210. The circuit 210 is controlled using the PWM signal. In other words, the circuit 210 needs the PWM signal.

The at least one sub unit 200 further includes a pull-up resistor 10. The pull-up resistor 10 is an element that prevents the circuit 20 from being floated when no input is supplied to the circuit 210. In other words, the malfunction of the circuit 210 is prevented via the pull-up resistor 10 when no input is supplied to the circuit 210.

Referring to FIG. 1, current flows in a route indicated by ① when the at least one sub unit 200 is connected to the main controller 100. Thus, the main controller 100 may check that the at least one sub unit 200 is connected thereto by measuring the voltage Vc supplied via the pull-up resistor 10 of the at least one sub unit 200. Also, current flows in a route indicated by ② when the at least one sub unit 200 is not connected to the main controller 100. Thus, the main controller 100 may determine that the at least one sub unit 200 is not connected the main controller 100 by measuring the ground voltage by using the pull-down resistor 20 connected to the ground.

The electronic device 50 may further include a display unit (not shown). The display unit may display whether the at least one sub unit 200 is connected to the main controller 100.

Figure 2:
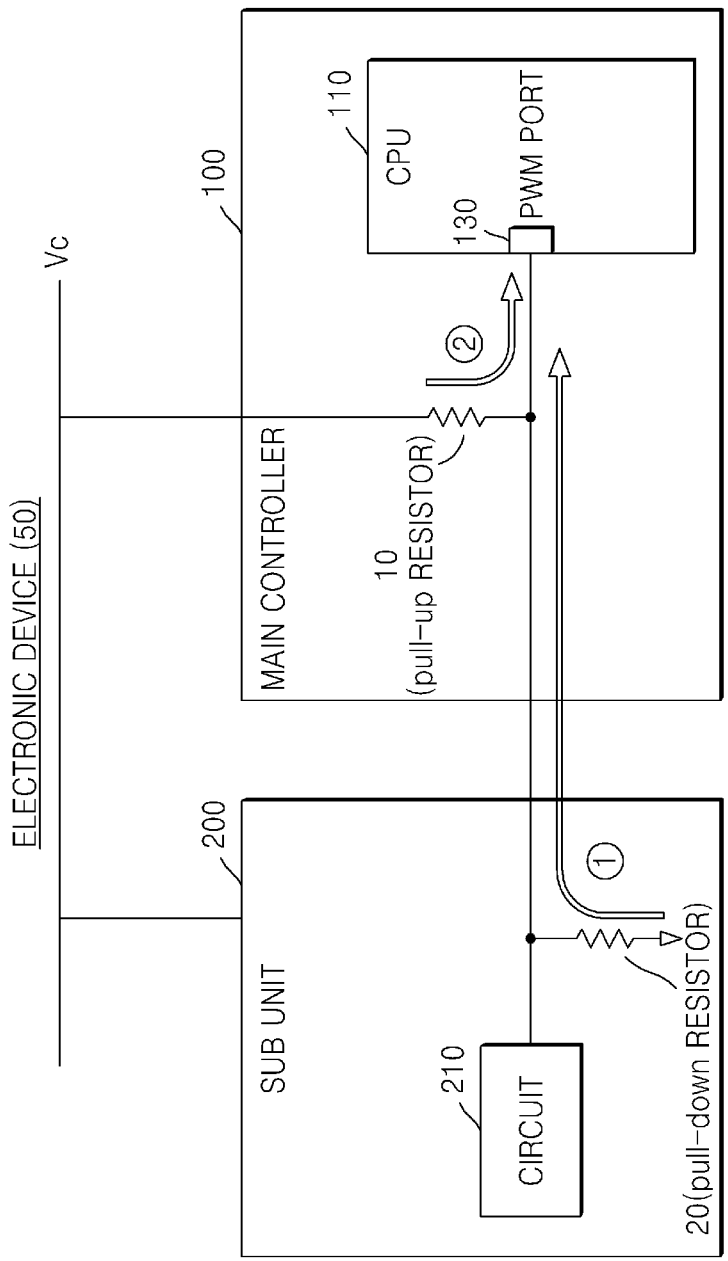
FIG. 2 illustrates an electronic device according to another embodiment of the present disclosure.

FIG. 2 illustrates an electronic device 50 according to another embodiment of the present disclosure. FIG. 2 is another embodiment of the electronic device 50 of FIG. 1. Thus, although not described below, the description of the electronic device 50 of FIG. 1 may also apply to the electronic device 50 of FIG. 2.

Referring to FIG. 2, in the electronic device 50, a main controller 100 includes a pull-up resistor 10 and a sub unit 200 includes a pull-down resistor 20. Thus, unlike in FIG. 1, in FIG. 2, a CPU 110 determines that the sub unit 200 is not connected to the main controller 100 when a voltage measured by a PWM port 130 is a high voltage, and determines that the sub unit 200 is connected to the main controller 100 when the voltage measured by the PWM port 130 is a low voltage.

Current flows in a route indicated by ① when the sub unit 200 is connected to the main controller 100. Thus, the main controller 100 may check that the sub unit 200 is connected to the main controller 100 by measuring a ground voltage using the pull-down resistor 20 of the sub unit 200. Also, current flows in a route indicated by ② when the sub unit 200 is not connected to the main controller 100. Thus, the main controller 100 may check that the sub unit 200 is not connected to the main controller 100 by measuring a voltage Vc by using the pull-up resistor 10 connected to a voltage Vc source.

Figure 3:
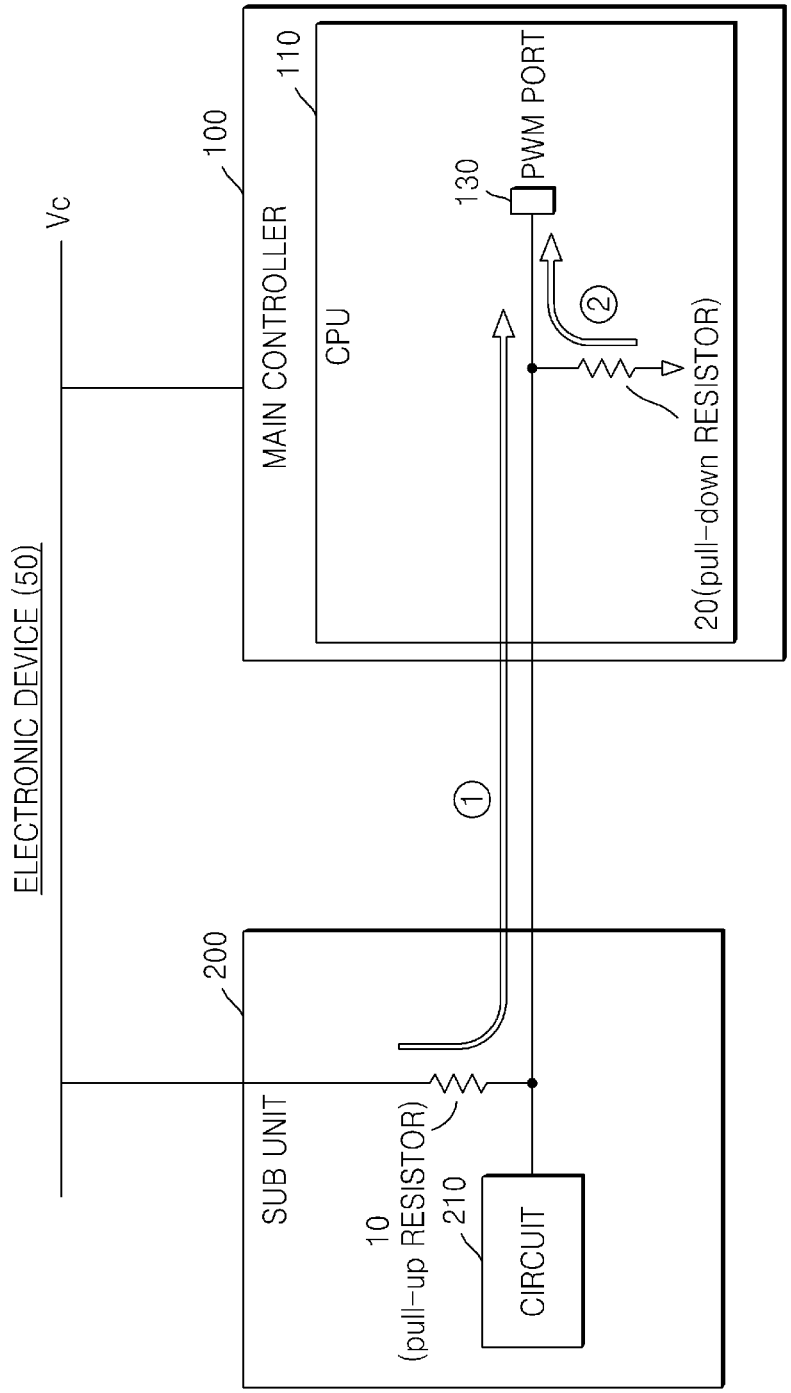
FIG. 3 illustrates an electronic device according to another embodiment of the present disclosure.

FIG. 3 illustrates an electronic device 50 according to another embodiment of the present disclosure. FIG. 3 illustrates another embodiment of the electronic device 50 of FIG. 1. Thus, although not described below, the description of the electronic device 50 of FIG. 1 may also apply to the electronic device 50 of FIG. 3.

In the electronic device 50 of FIG. 3, a pull-down resistor 20 is included in a CPU 110. Thus, when a sub unit 200 is not connected to a main controller 100, the main controller 100 senses a ground voltage by using the pull-down resistor 20 included in the CPU 110. When the sub unit 200 is connected to the main controller 100, the main controller 100 senses a voltage Vc by using a pull-up resistor 10 of the sub unit 200.

Figure 4:
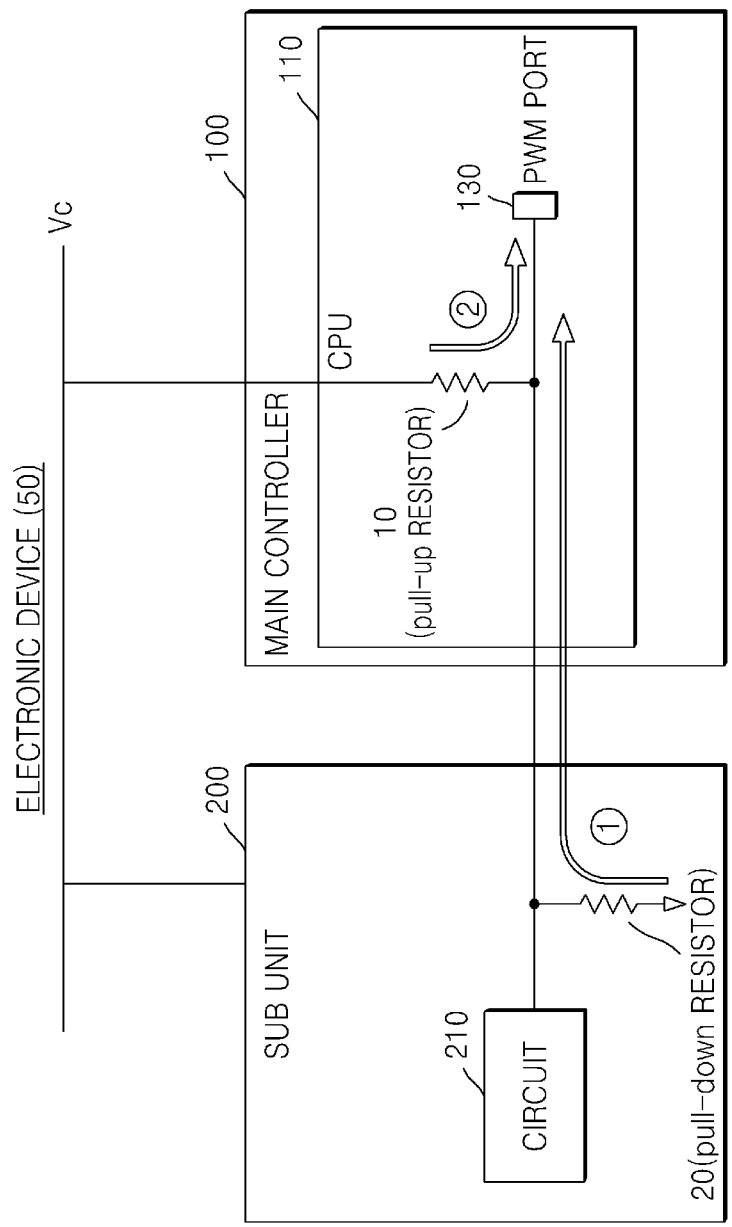
FIG. 4 illustrates an electronic device according to another embodiment of the present disclosure.

FIG. 4 illustrates an electronic device 50 according to another embodiment of the present disclosure. FIG. 4 illustrates another embodiment of the electronic device 50 of FIG. 1. Thus, although not described below, the description of the electronic device 50 of FIG. 1 may also apply to the electronic device 50 of FIG. 4.

In the electronic device 50 of FIG. 4, a pull-up resistor 10 is included in a CPU 110. Thus, when a sub unit 200 is not connected to a main controller 100, the main controller 100 senses a voltage Vc using the pull-up resistor 10 included in the CPU 110. When the sub unit 200 is connected to the main controller 100, the main controller 100 senses a ground voltage by a pull-up resistor 20 of the sub unit 200.

Figure 5:
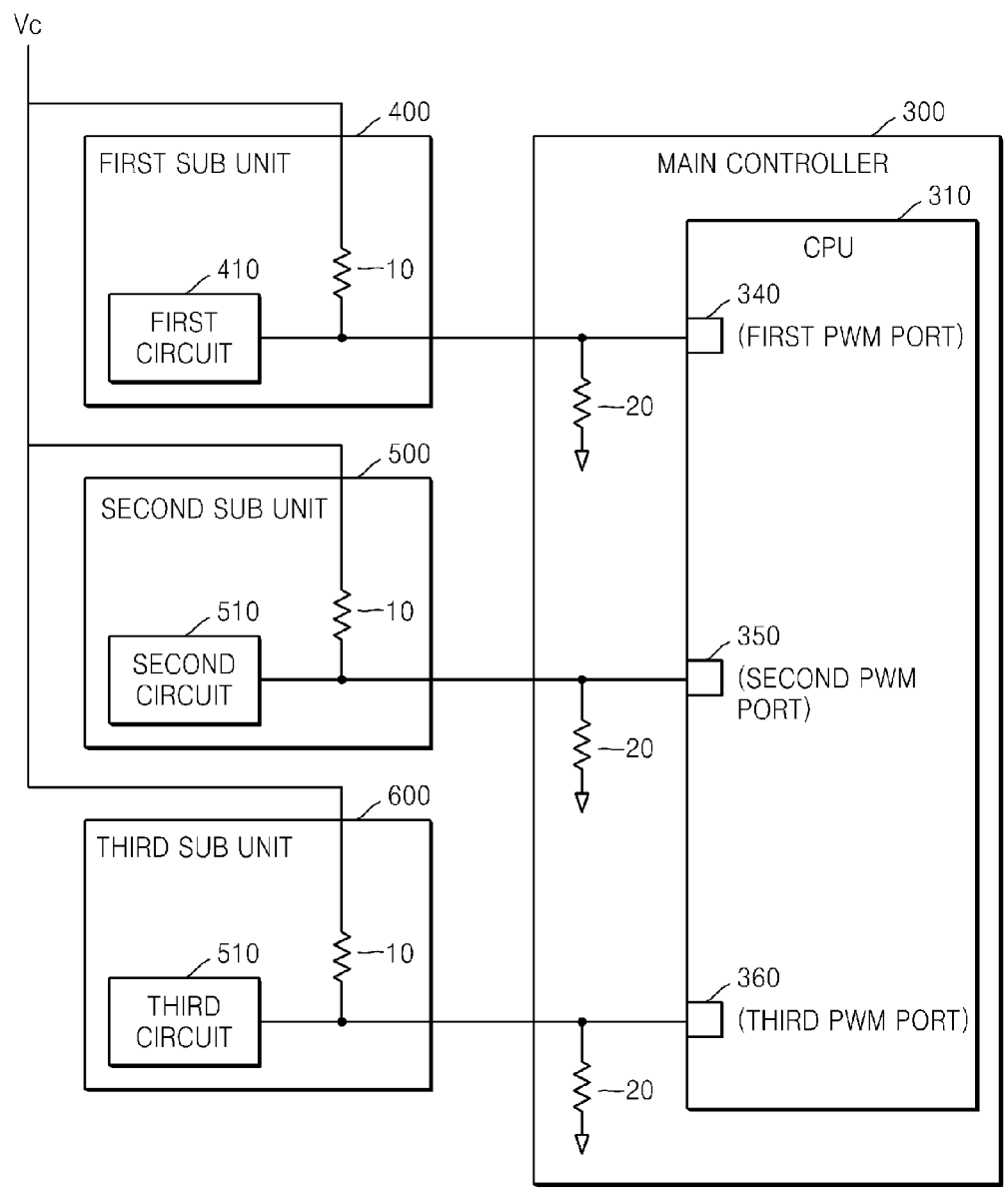
FIG. 5 illustrates an electronic device that includes a plurality of sub units according to another embodiment of the present disclosure.

FIG. 5 illustrates an electronic device that includes a plurality of sub units according to another embodiment of the present disclosure. FIG. 5 is another embodiment of the electronic device 50 of FIG. 1. Thus, although not described below, the description of the electronic device 50 of FIG. 1 may also apply to the electronic device of FIG. 5.

The electronic device of FIG. 5 includes a main controller 300, and a plurality of sub units 400, 500, and 600. The main controller 300 includes a CPU 310 that includes a plurality of PWM ports 340, 350, and 360. The plurality of sub units 400, 500, and 600 each include a pull-up resistor 10, and respectively include circuits 410, 510, and 610 controlled by a PWM signal. The first to third circuits 410, 510, and 610 are respectively connected to the first to third PWM ports 340, 350, and 360. The PWM ports 340, 350, and 360 are respectively connected to pull-down resistors 20.

The electronic device may check whether the plurality of sub units 400, 500, and 600 are connected to the main controller 300. The electronic device uses the first to third PWM ports 340, 350, and 360 of the main controller 100 as input ports. The electronic device determines whether the first to third PWM ports 340, 350, and 360 are connected to the first to third circuits 410, 510, and 610, based on voltages measured by the first to third PWM ports 340, 350, and 360. Thus, the electronic device may simultaneously check whether the plurality of sub units 400, 500, and 600 are connected to the main controller 300. Also, the electronic device may display which sub unit among the plurality of sub units 400, 500, and 600 is connected to the main controller 300 by using a display unit (not shown).

Although FIG. 5 illustrates a case in which the main controller 300 includes the pull-down resistors 20, the main controller 300 may alternatively include the pull-up resistors 10. When the main controller 300 includes the pull-up resistors 10, the first to third sub units 400, 500, and 600 respectively include the pull-down resistors 20. Alternatively, the pull-down resistors 20 may be included in the CPU 310 of the main controller 300. Various cases have been described above with reference to FIGS. 1 to 4 and are thus not described in further detail here.

Figure 6:
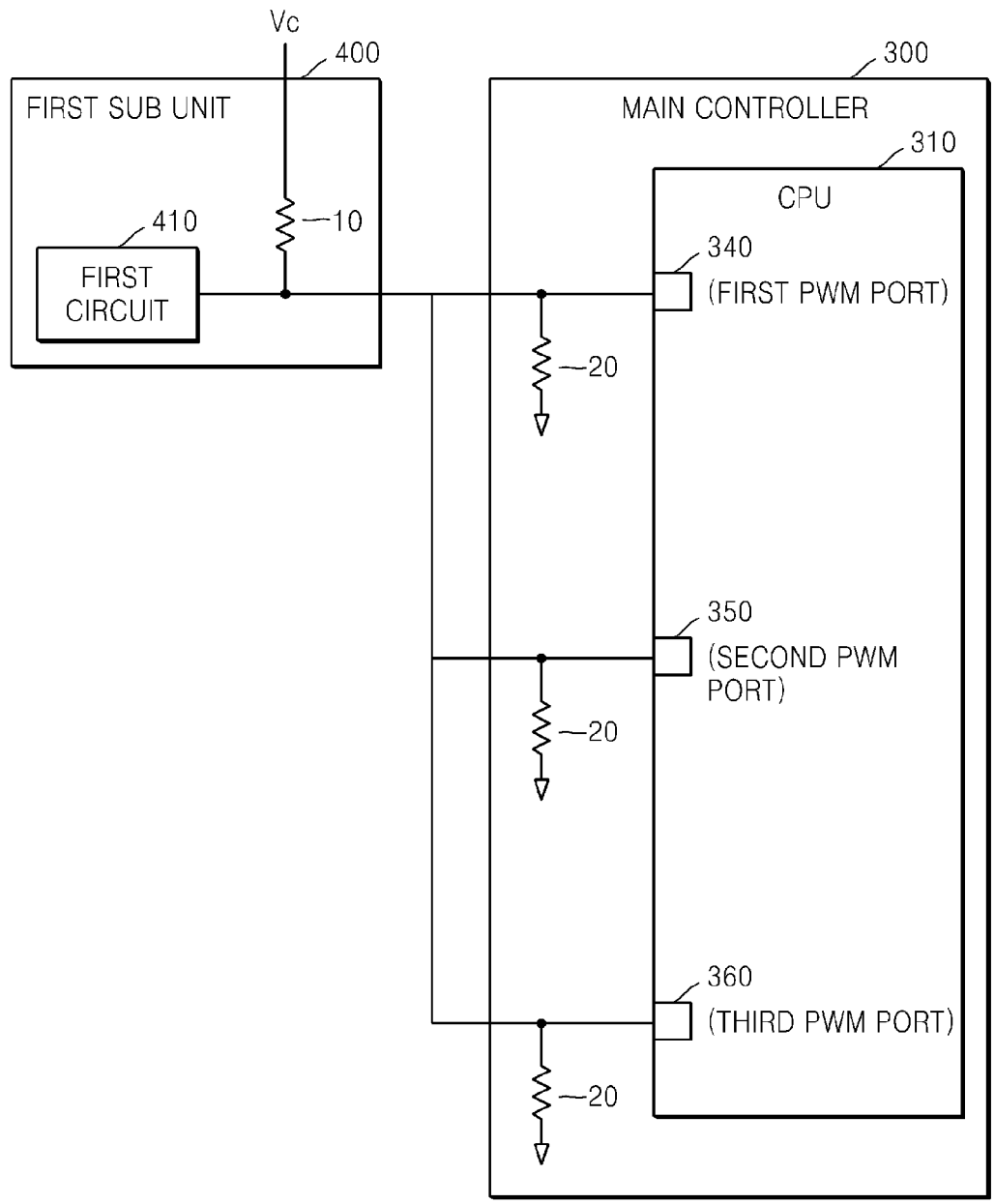
FIG. 6 illustrates an electronic device in which one sub unit is connected to a plurality of PWM ports according to another embodiment of the present disclosure.

FIG. 6 illustrates an electronic device 50 in which one sub unit is connected to a plurality of PWM ports according to another embodiment of the present disclosure.

Referring to FIG. 6, the first sub unit 400 may be connected to the plurality of PWM ports 340 through 460. The electronic device 50 checks which one or more of the plurality of PWM ports 340, 350, or 360, of the main controller 100 that the first sub unit 400 is connected to.

In the electronic device 50 of FIG. 6, the main controller 100 checks that the first sub unit 400 is connected to the PWM port, which measures a pull-up voltage of the first sub unit 400. Also, the main controller 100 checks that the first sub unit 400 is not connected to the PWM port, which measures a ground voltage.

When the first sub unit 400 is connected to all the three PWM ports 340, 350, and 360, all the PWM ports 340, 350, and 360 measure the pull-up voltage. However, when the first sub unit 400 is not connected to any one of the PWM ports 340, 350, or 360, the PWM port, which is not connected to the first sub unit 400, measures the ground voltage.

The CPU 310 may select at least one PWM port from the PWM ports 340, 350, or 360 to check whether the first sub unit 400 is connected to the at least one PWM port. The CPU 310 may use the selected PWM port as an input port and may check whether the first sub unit 400 is connected to the selected PWM port by using a size of voltage measured in the PWM port.

Figure 7:
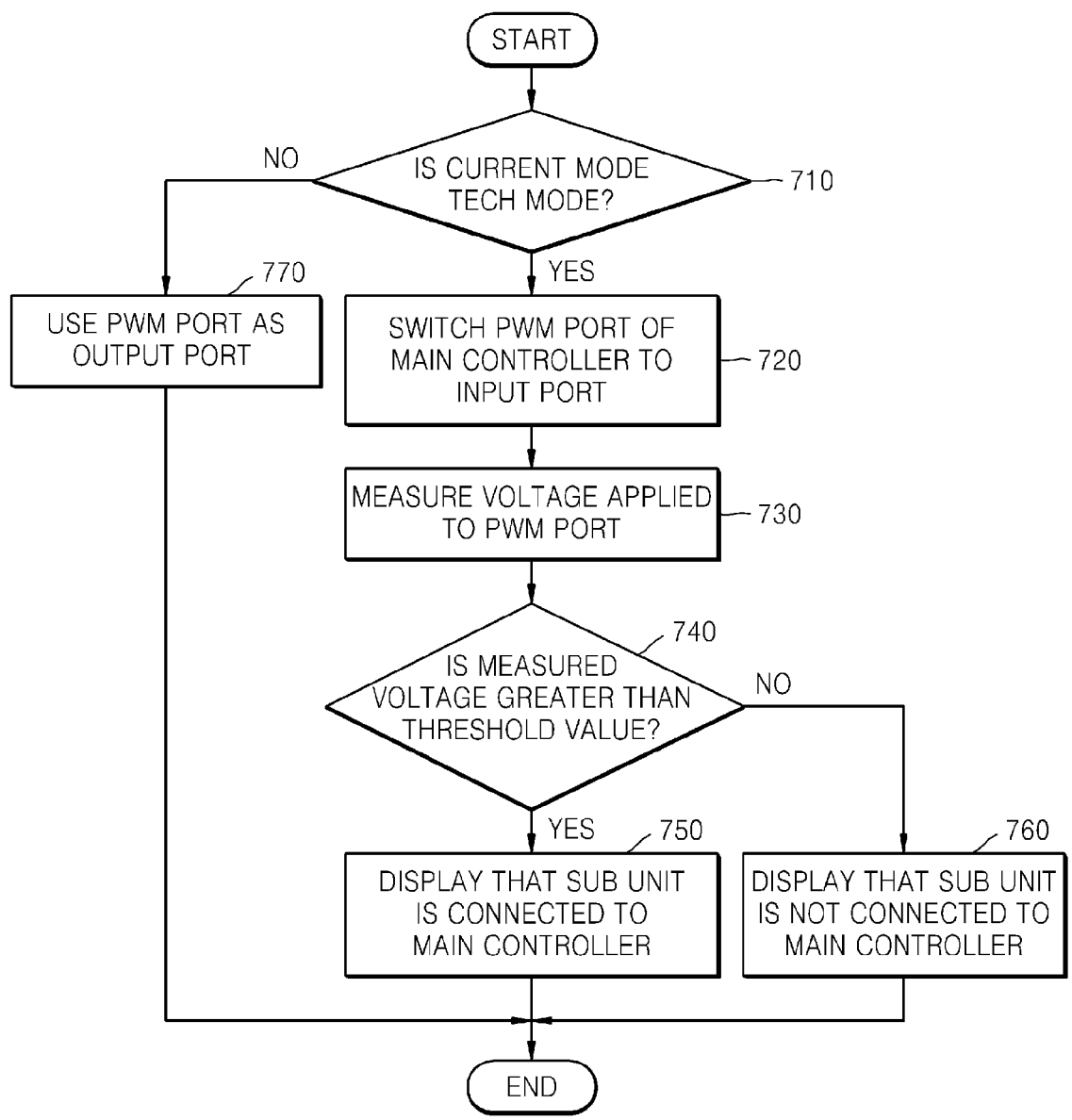
FIG. 7 is a flowchart of a method of allowing a main controller to check whether a sub unit is connected to the main controller according to an embodiment of the present disclosure.

FIG. 7 is a flowchart of a method of allowing a main controller to check whether a sub unit is connected thereto according to an embodiment of the present disclosure. FIG. 7 is another embodiment of the electronic device 50 of FIG. 1. Thus, although not described below, the description of the electronic device 50 of FIG. 1 may also apply to the flowchart of FIG. 7.

Referring to FIGS. 1 and 7, in operation 710, the main controller 100 determines whether a current mode is a tech mode. Operation 720 is performed when the current mode is the tech mode, and operation 770 is performed when the current mode is not the tech mode. The tech mode may be selected by a user.

In operation 720, the main controller 100 uses the PWM port 130 as an input port. In other words, the main controller 100 enters a mode for checking whether the sub unit 200 is connected to the main controller via the PWM port 130.

In operation 730, the main controller 100 measures a voltage applied to the PWM port 130.

In operation 740, the main controller 100 determines whether the measured voltage is greater than a threshold value. Operation 750 is performed when the measured voltage is greater than the threshold value, and operation 760 is performed is performed when the measured voltage is not greater than the threshold value.

FIG. 7 illustrates a case in which the sub unit 200 is connected to the main controller 100 when the measured voltage is a high voltage. In other words, FIG. 6 illustrates a case in which the sub unit 200 includes a pull-up resistor. If the sub unit 200 includes a pull-down resistor, operation 760 is performed when the measured voltage is greater than the threshold value, and operation 750 is performed when the measured voltage is not greater than the threshold value.

In operation 750, the main controller 100 displays that the sub unit 200 is connected to the main controller by using a display unit.

In operation 760, the main controller 100 displays that the sub unit 200 is not connected to the main controller by using the display unit.

In operation 770, the main controller 100 uses the PWM port 130 as an output port.

Figure 8:
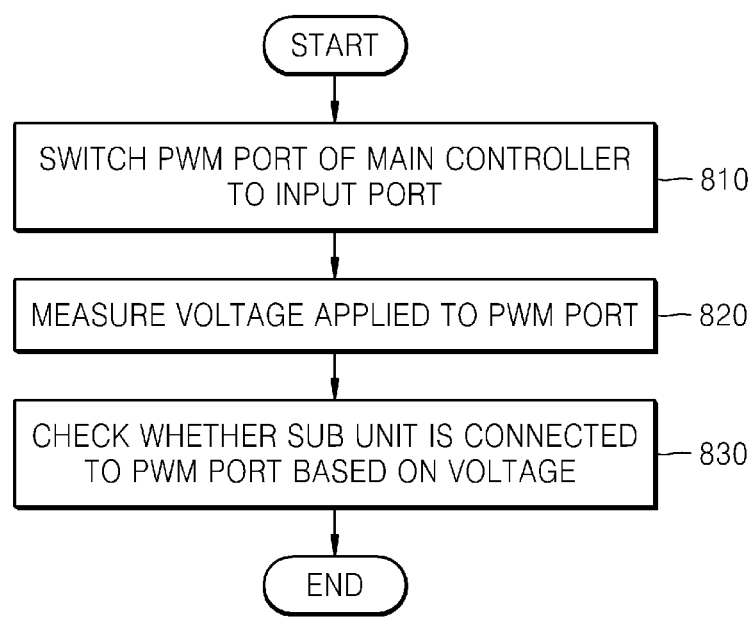
FIG. 8 is a flowchart of a method of allowing a main controller to check whether a sub unit is connected to the main controller according to another embodiment of the present disclosure.

FIG. 8 is a flowchart of a method of allowing a main controller to check whether a sub unit is connected thereto according to another embodiment of the present disclosure. FIG. 8 is another embodiment of the electronic device 50 of FIG. 1. Thus, although not described below, the description of the electronic device 50 of FIG. 1 also applies to the flowchart of FIG. 8.

Referring to FIGS. 1 and 8, in operation 810, the main controller 100 uses the PWM port 130 as an input port.

In operation 820, the main controller 100 measures a voltage applied to the PWM port 130. The main controller 100 measures the voltage applied via the PWM port 130 rather than generating a PWM signal.

In operation 830, the main controller 100 checks whether the sub unit 200 is connected to the PWM port 130, based on the measured voltage. The main controller 100 compares the measured voltage with a preset threshold value. The main controller 100 determines whether the sub unit 200 is connected to the PWM port 130 when the measured voltage is greater than or less than the threshold value.

The main controller 100 may check whether the sub unit 120 is connected thereto by using the PWM port 130. Accordingly, the electronic device 50 does not need an additional input port other than the PWM port 130. Thus, the sub unit 200 need not be connected to additional input port.

The above embodiments of the present disclosure may be embodied as a computer program. The computer program may be stored in a computer readable recording medium, and executed using a general digital computer or processor. Also, a data structure used in the above embodiments may be recorded on a computer readable recording medium via various means. Examples of the non-transitory computer readable medium include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like.

Examples of the computer program discussed here include both machine code, such as produced by a compiler, and files containing higher level code that may be executed by the computer using an interpreter. The described hardware devices may be configured to act as one or more software modules in order to perform the operations of the above-described embodiments, or vice versa.

Any software module described herein may be executed by a dedicated hardware-based computer or processor unique to that unit or by a hardware-based computer or processor common to one or more of the modules. The described methods may be executed on a general purpose computer or processor or may be executed on a particular machine such as the apparatusses or devices described herein.

While the present disclosure has been particularly shown and described with reference to exemplary embodiments thereof, it will be understood by those of ordinary skill in the art that various changes in form and details may be made therein without departing from the spirit and scope of the disclosure as defined by the appended claims. The exemplary embodiments should be considered in descriptive sense only and not for purposes of limitation. Therefore, the scope of the disclosure is defined not by the detailed description of the disclosure but by the appended claims, and all differences within the scope will be construed as being included in the present disclosure.

What is claimed is:

1. An electronic device comprising:
   a main controller including a pulse width modulation (PWM) port usable as an output port or an input port according a user command; and
   a sub-unit configured to receive a PWM signal from the main controller and to operate according to the received PWM signal,
   wherein the main controller is configured to check whether the sub-unit is connected to the main controller using the PWM port as the input port.

2. The electronic device of claim 1, wherein the main controller checks whether the sub-unit is connected to the main controller by measuring a voltage applied to the PWM port.

3. The electronic device of claim 1, wherein the main controller uses the PWM port as the input port when the main controller operates in a tech mode.

4. The electronic device of claim 1, wherein the sub-unit comprises a plurality of sub-units and the electronic device further comprising a display unit configured to display a result of checking whether the plurality of sub-units is connected to the main controller, and
   wherein the main controller configured to display a sub-unit that is not connected to the main controller among the plurality of sub-units, on the display unit.

5. The electronic device of claim 1, wherein, when the sub-unit includes a pull-up circuit, the main controller comprises a pull-down circuit, and
   when a pull-up voltage is measured, the main controller determines that the sub-unit is connected to the main controller.

6. The electronic device of claim 1, wherein, when the sub-unit includes a pull-down circuit, the main controller comprises a pull-up circuit, and
   when a pull-down voltage is measured, the main controller determines that the sub-unit is connected to the main controller.

7. A method of checking whether a sub-unit of an electronic device is connected to a main controller of the electronic device, the method comprising:
   receiving an input of user of the electronic device;
   using a pulse-width modulation (PWM) port of the main controller as an input port or an output port based on the received user input;
   upon the PWM port being used as the input port, measuring a voltage applied to the PWM port; and
   checking whether the sub-unit is connected to the PWM port, based on the measured voltage.

8. The method of claim 7, wherein the using of the PWM port of the main controller as the input port comprises using the PWM port as the input port when the main controller operates in a tech mode.

9. The method of claim 7, wherein the sub-unit of the electronic device comprises a plurality of sub-units and the method further comprises displaying a sub-unit of the electronic device that is not connected to the main controller of the electronic device among the plurality of sub-units, on a display unit of the electronic device.

10. The method of claim 7, wherein, when the sub-unit includes a pull-up circuit, the main controller comprises a pull-down circuit, and the checking of whether the sub-unit is connected to the PWM port comprises determining that the sub-unit is connected to the main controller when the voltage is a pull-up voltage.

11. The method of claim 7, wherein, when the sub-unit includes a pull-down circuit, the main controller comprises a pull-up circuit, and
the checking of whether the sub-unit is connected to the PWM port comprises determining that the sub-unit is connected to the main controller when the voltage is a pull-down voltage.

12. An electronic device comprising:
a main controller comprising a pull-up resistor or a pull-down resistor, the main controller including a port usable as an output port or an input port according a user command; and
a sub-unit of the main controller, the sub-unit comprising the other of the pull-up resistor or the pull-down resistor,
wherein the electronic device is configured to determine whether the sub-unit is connected to the main controller using the pull-up resistor or the pull-down resistor.

13. The electronic device of claim 12, wherein the main controller comprises a pulse width modulation (PWM) port that outputs a PWM signal.

14. The electronic device of claim 13, wherein the main controller checks whether the sub-unit is connected to the main controller, based on a voltage measured by the PWM port.

15. The electronic device of claim 14, wherein when the PWM port is used as the output port the main controller outputs the PWM signal to the sub-unit and measures a voltage applied from the sub-unit to determine whether the sub-unit is connected to the main controller.

16. The electronic device of claim 14, wherein when the PWM port is used as the input port the main controller measures a voltage applied from ground to determine whether the sub-unit is connected to the main controller.

17. The electronic device of claim 15, wherein the main controller determines that the sub-unit is connected to the main controller when the voltage measured by the PWM port is a first voltage, and determines that the sub-unit is not connected to the main controller when the voltage measured by the PWM port is a second voltage.

18. The electronic device of claim 12, wherein the sub-unit comprises a plurality of sub-units and further comprising:
a display unit configured to display a result of determining whether each of the plurality of sub-units is connected to the main controller,
wherein the display is configured to indicate whether each sub-unit of the plurality of sub-units is connected or not connected to the main controller.

19. The electronic device of claim 12, wherein the electronic device is configured to determine whether the sub-unit is electrically connected to the main controller using the pull-up resistor or the pull-down resistor.

* * * * *